United States Patent [19]

Chapman

[11] Patent Number: 4,459,684

[45] Date of Patent: Jul. 10, 1984

[54] NONVOLATILE JRAM CELL USING NONVOLATILE CAPACITANCE FOR INFORMATION RETRIEVAL

[75] Inventor: Richard A. Chapman, Dallas, Tex.

[73] Assignee: Texas Instruments Incorporated, Dallas, Tex.

[21] Appl. No.: 269,926

[22] Filed: Jun. 2, 1981

[51] Int. Cl.³ .............................................. G11C 11/00
[52] U.S. Cl. .................................. 365/174; 365/184; 365/149
[58] Field of Search ............... 365/149, 174, 177, 191, 365/184; 357/23 VT

[56] References Cited

U.S. PATENT DOCUMENTS 4,127,900  11/1978  Raffel et al. ........................ 365/191

OTHER PUBLICATIONS

H. S. Lee, "MNOS Varactor Bootstrap Memory Cell", IBM Technical Disclosure Bulletin, vol. 17, No. 11, Apr. 1975, p. 3214.

*Primary Examiner*—Joseph A. Popek
*Attorney, Agent, or Firm*—Gary Honeycutt; Rich Donaldson; Mel Sharp

[57] ABSTRACT

Non-volatile JRAM cell having interelectrode nonvolatile capacitance which is readable and varies with the electrical charge on elements of the device. To program the nonvolatile capacitance, the address lines (word line and bit line) are biased so that a charge is given to the nonvolatile multidielectric stack between the MIS gate and the JFET source of the cell. For a charge of one polarity, an inversion layer of electrons (for a P-type substrate) is formed on the surface of the JFET source, increasing the capacitance between the MIS gate electrode and the JFET gate electrode. For the opposite polarity, an accumulation layer forms at the JFET source surface, decreasing the interelectrode capacitance. The cell is read by presetting one address line, floating that line, then putting a pulse on the other line while reading the voltage output on the floating line.

13 Claims, 7 Drawing Figures

INVERSION LAYER ON SURFACE OF JFET SOURCE

ACCUMULATION LAYER ON SURFACE OF JFET SOURCE

NONVOLATILE JRAM CELL USING NONVOLATILE CAPACITANCE FOR INFORMATION RETRIEVAL

BACKGROUND OF THE INVENTION

This invention relates to semiconductor memory devices, and more specifically to a nonvolatile memory cell having a single vertical JFET device with a capacitively coupled source having variable capacitance characteristics. Non-volatile memories have distinct advantages over dynamic and static memories, in that data is not lost when operating power is removed and rapid refresh cycles are not required.

In U.S. patent application Ser. No. 228,413 filed Jan. 26, 1981, Bate discloses a non-volatile cell called a non-volatile JRAM which contains a single vertical channel JFET device as an addressed gate underneath an MIS gate which utilizes a nonvolatile insulator. Using appropriate voltage waveforms on the MIS gate and JFET gate, nonvolatile states can be written to place positive or negative charge into the memory insulator by placing large negative or positive voltages on the MIS gate when the JFET channel is open.

The nonvolatile state of the memory insulator is read by (1) attempting to reverse bias the JFET source immediately beneath the MIS gate by applying an appropriate voltage to the MIS gate before and during closing of the JFET channel and then, (2) determining whether a reverse bias was obtained by floating the MIS gate and observing its voltage change when the JFET channel is reopened. In patent application (Ser. No. 269,201, filed June 2, 1981), the same read mechanism is used, but the nonvolatile states are written using only one sign of voltage on either the MIS gate or the JFET gate. The present invention improves the read mechanism used in patent application Ser. Nos. 228,413 and 269,201 in two major ways. These two applications read the nonvolatile state of the memory insulator by attempting to reverse bias the JFET source. The reverse biased JFET source can be discharged by the flow of current to the source from the JFET gate, the semiconductor substrate, the semiconductor surface, or the depletion layers separating these regions. These currents can be larger in high capacitance cells such as cells with MNOS capacitors due to edge effects associated with large electric fields and fabrication process induced defects.

If the reverse bias is discharged before the volatile state can be sensed, then the nonvolatile state of the insulator cannot be read. The present invention overcomes this difficulty by sensing the voltage feedthrough from word line to bit line which will depend on the absence or presence of an inversion layer underneath the memory insulator depending on the programmed state of the memory insulator. Since the inversion layer will be present or absent at equilibrium, there is no need to preset a nonequilibrium reverse bias and there is no sensitivity to dark currents. The other major improvement is that since a reverse bias does not have to be preset, no voltage pulse has to be applied to the bit line which would normally have a small disturbing effect on the nonvolatile state of the memory insulator.

The present invention is also an improvement over MNOS DRAM cells as related in an article by R. Kondo, "Dynamic Injection NMOS Memory Devices", Japanese Journal of Applied Physics, Vol. 19, Supplement 19-1, p. 231–237, 1980, where the larger dark currents associated with NMOS edge effects and the nonequilibrium voltage states caused the same deleterious effects described above for the NVJRAM cells with the read mechanism of patent application Ser. No. 228,413.

Crosspoint nonvolatile capacitor cells placed at the intersection of orthogonal bit or word lines but without nonvolatile JRAM's have been investigated by J. I. Raffel and J. A. Yasaitis, "Programmable Read-Only Memories", 1977 International Solid States Circuits Conference, p. 190–193 and 251, 1977, using a voltage ramp on the word line and sensing the capacitive feedthrough to the bit line. The present invention utilizes a more sensitive detection scheme in which a voltage step or pulse rather than a ramp is applied to the word line in a state-of-the-art DRAM sense latch is used to sense the small voltage feedthrough and then latch to a voltage such as zero volts in one state and +5 volts in the other state, depending on the written state of the memory insulator. In the present invention, the effect of nonselected cells on sensitivity is removed by reverse biasing all nonselected cell word lines sufficiently to pull out an inversion layer which may have been previously programmed in some cells.

In the past, MNOS capacitors have been used with a static RAM cell as related by S. Saito et al, "N-Channel High Speed Nonvolatile Static RAM Utilizing MNOS Capacitors", Japan Journal of Applied Physics, Vol. 19, Supplement 19-1, pages 225–229, 1980, to provide nonvolatile information storage backup in the case of loss of electrical power. In this previous cell, one NMOS capacitor is placed on each of the two sides of the static latch. In the present invention, the nonvolatile capacitors are NVJRAM cells with many of these NVJRAM cells being placed on one bit line feeding each of the two inputs to the static latch which now becomes a DRAM-like sense latch. Furthermore, the present invention is a high density nonvolatile RAM rather than a static RAM with nonvolatile backup.

Therefore, the present invention is in effect a crosspoint capacitor memory array in which the small programming crosstalk effects inherent in the device of Raffel and Yasaitis have been diminished by the vertical JFET and in which a more sensitive capacitor read mechanism using voltage steps or pulses and the sense latch circuits have been utilized. The read disturb effects inherent in U.S. patent application Ser. No. 228,413 and in Raffel and Yasaitis have been overcome by using a capacitance sense mechanism rather than preparing a nonequilibrium state. The low packing density of the static RAM cell of Saito has been converted into a high packing density DRAM-type cell and the information is always stored in the memory insulator rather than using it only as a nonvolatile backup.

The object of this invention is to provide a nonvolatile random access memory cell for which the operation of reading the nonvolatile state of the cell has an improved (lower) disturbing effect on the nonvolatile state being read, with this improvement being obtained by reducing the reading voltage applied to the cell. Another object is to provide a read mechanism which does not utilize a nonequilibrium read mechanism which is strongly sensitive to dark currents, such as would be the case if a standard DRAM volatile write and read had been used. Another object is to provide a high sensitivity read operation for programmable capacitors which is compatible with the use of sense latches and has a sensitivity which is not affected by the pattern of data programmed at bits along one sense line. Yet another object is to provide a high packing density of programmable capacitors with as few components per cell as possible, having minimum read disturb and pattern sensitivity.

SUMMARY OF THE INVENTION

In one aspect of the present invention, there is provided a nonvolatile memory cell having a single vertical JFET as the addressing element for the cell. In a preferred embodiment, ion-implanting of n-type impurities in a p-type substrate creates a channel with islands of the p-type substrate surface appearing at spaced intervals. The channel serves as a JFET gate for each device, and also, as an address (word) line in a matrix of these memory cells. In one embodiment, the channel also is one electrode of the programmable capacitor of the cell. An insulating layer of, for example, silicon oxide covers the P-type source region and layers of dielectric material such as silicon dioxide, silicon nitride and titanium oxide, covered by a conducting electrode, form the nonvolatile MIS gate and other electrode of the capacitor. A conductive strip of material, for example, aluminum is formed over the nonvolatile MIS gate and, in one embodiment, provides a bit line for addressing and sensing of the cell.

In a random access memory array formed with the plurality of the disclosed cells, a matrix is arranged which includes a plurality of buried n-type address or word lines in parallel arrangement, and a plurality of bit lines formed as conductive strips over the cells and arranged in parallel, generally perpendicular to the n-type lines.

In another aspect, the cell stores data by introducing biases on the word and address lines to alter the charge stored in the nonvolatile insulator of the device, which in turn alters the capacitance between the MIS gate and the JFET gate, and thereby the capacitance between word and bit lines.

This alteration of device inter-electrode capacitance is readily sensed by a step or pulse on the word line voltage while reading the bit line. In one embodiment, the MIS gates are attached to the bit lines and the JFET gates are attached to the word lines. In another embodiment, the JFET gates are attached to the bit lines and the MIS gates are attached to the word lines. The cell is read by setting the bit line to a fixed potential, then floating it. The word line not floated has a positive or negative voltage step or pulse impressed upon it. The difference in the signal coupled from word to bit lines is easily determined by an output MOSFET device or by a sense latch, and data readout thereby accomplished.

The novel features believed to be resident in the invention are set forth in the appended claims. The invention itself, however, as well as further objects and advantages thereof will be best understood by reference to the following detailed description when read in conjunction with the accompanying drawings.

DETAILED DESCRIPTION OF THE DRAWINGS

Figure 1:
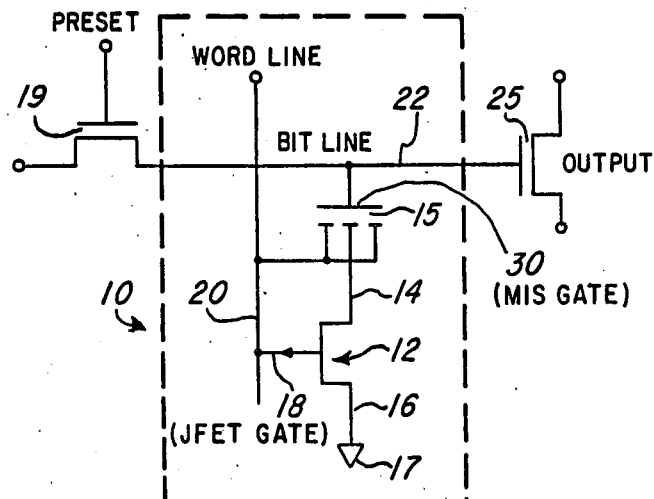
FIG. 1 is a schematic diagram of the memory cell with MIS gate attached to the bit line and the JFET gate attached to the word line.

Referring now to the drawings, there is shown in FIG. 1, a schematic diagram of a single, nonvolatile, junction field effect transistor random access memory (JRAM) cell attached to a preset MOSFET 19 and an output MOSFET 25 for programming and sensing. Memory cell 10 is formed of a vertical JFET 12 having a source 14 which is coupled to the channel underneath the storage element 15, a drain 16 coupled to the substrate 17, and a JFET gate 18, which is part of a word line 20 in this embodiment. Storage element 15 is also covered by an MIS gate 30 which is coupled to a bit sense line 22 in this embodiment. A typical RAM is formed of a matrix of cells 10 coupled to a plurality of rows of sense lines 22 and columns of word lines 20. A specific cell is addressed by the simultaneous signal on the bit sense and word lines. The output transistor 25 is provided for sensing the output of storage element 15 during a read operation.

The preset transistor is used for addressing programming voltages to the bit lines, for presetting the bit line voltage before reading, and for floating the bit line during reading.

Figure 2:
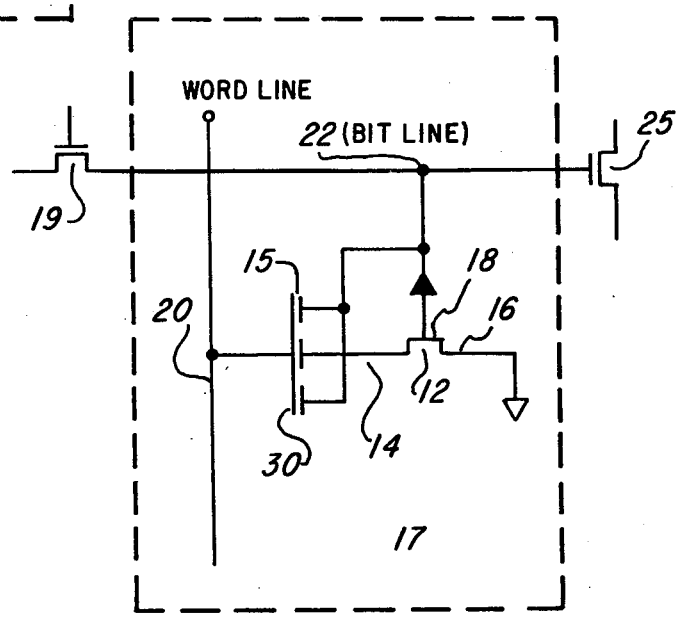
FIG. 2 is a schematic diagram of another embodiment of the memory cell with JFET gate attached to the bit line and the MIS gate attached to the word line.

FIG. 2 shows a second embodiment of the memory cell in which connections of the JFET gate and MIS gate have been reversed in comparison to that in FIG. 1.

Figure 3:
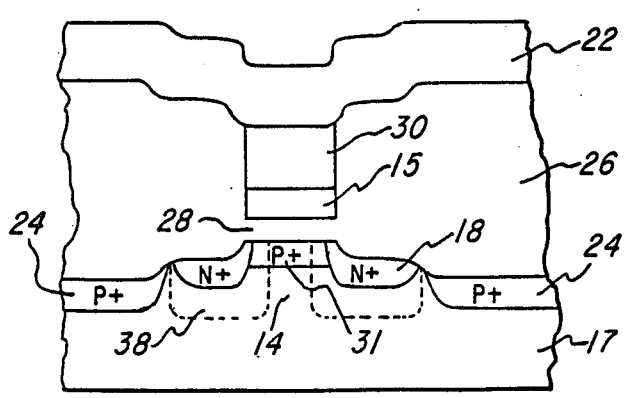
FIG. 3 is a cross sectional view of the device as implemented in the preferred embodiment.

Referring to FIG. 3, the structure of cell 10 may be better understood. A portion of the semiconductor substrate, for example silicon, is shown generally at 17. The substrate may be either n-type or p-type depending on design considerations. For purposes of illustration, it will be assumed that a p-type substrate and the embodiment of FIG. 1 are used.

Word line 20 is an elongated n-type region which also forms the gates 18 for all of the JFET's in a column. A p-type region on either side of the gate region forms a channel stop 24 to isolate the cell 10. A relatively thick insulating layer 26 of, for example silicon dioxide, covers the gate 18 and channel stop 24 for isolation.

A thin gate oxide region 28 which is 20-40 angstroms thick is directly over the source 14 of JFET 12. Storage element 15 is formed of a multidielectric structure overlying the gate oxide 28 and surrounded by oxide layer 26. The multidielectric structure is covered by a conducting layer of metal or polysilicon. The cell is programed in the following manner. This programming of the cell requires the multidielectric structure 15 above the source region 31 to have a charge imported to it through the thin oxide 28 and the polarity of this charge will determine whether an inversion layer is present at the surface of the source region. To program a positive charge into the insulator, a negative voltage, such as −20 volts, is applied to the bit sense line and MIS gate. The required voltage is dependent upon the thickness of the insulating layer 28 and the thickness of the multidielectric structure 15 being charged. While the negative voltage is applied to the bit sense line, the word line and JFET gate are held at a zero potential. This bias causes the insulator layer to be positively charged. After the programming voltage is removed, the positive charge in the insulator attracts electrons from the JFET gate region and causes an inversion layer to form over the surface of the JFET source region. Cells on the bit line which were not to be programed when the −20 volt pulse was applied had their word lines at say +5 volts in order to close their JFET channels and float their JFET sources which then became reverse biased through the effect of the −20 volt pulse, thereby resulting in insufficient voltage drop for programming across the memory insulator 15 and thin insulator 28.

To program a negative charge into the insulator, a positive voltage, such as +20 volts is applied to the bit line and MIS gate while the word line and JFET gate are held to a zero potential. The +20 volts on the MIS gate 30 temporarily pulls an inversion layer over the JFET source 18 and then pulls electrons into the insulator 15 from the inversion layer and/or pushes positive charge from the insulator into the inversion layer. When the +20 volt programming pulse is removed from the MIS gate 30, the negative charge in the memory insulator 15 repels the inversion layer and an accumulation of positive holes form over the JFET source 31. Those cells connected to the bit line which are not to be programed have their word lines and JFET gates reversed biased to increase the potential of the inversion layer during the +20 volt pulse so that insufficient voltage for programming occurs across the memory insulator. The above programming mechanisms are as described in patent application Ser. No. 228,413. The unipolar-voltage programming of patent application Ser. No. 269,201 could also be used.

The reading or sensing of the nonvolatile state of the memory insulator 15 can be described by reference to FIGS. 1 and 4 or the embodiment with MIS gates attached to the bit line. When negative charge has been previously programed into the memory insulator 15, the state shown in FIG. 4b occurs with the accumulation layer. The capacitance between bit line and word line is now $C_{bw}$ which is due to the capacitance from conductor 30 and bit line 22 to the JFET gate 18 through insulator 26 and, in those cases with overlap of JFET gate 18 and conductor 30, there will be additional capacitance through a small area of insulators 15 and 28 around the periphery of JFET source 31. The capacitance $C_{bw}$ is designed to be small. The very large capacitance $C_{ins}$ through thin memory insulator 15 and JFET gate 18 is A/C-coupled to the substrate 17 though the JFET in this case. This model neglects the sidewall capacitance between the JFET source 31 and the JFET gate 18 in comparison with the other capacitances.

Figure 4A:
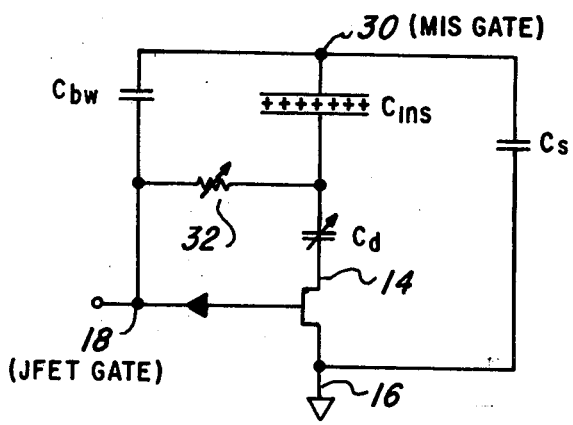
FIGS. 4A and 4B show the equivalent circuits for the nonvolatile capacitor NVJRAM in two different programed states for a p-channel JFET.
Figure 4B:
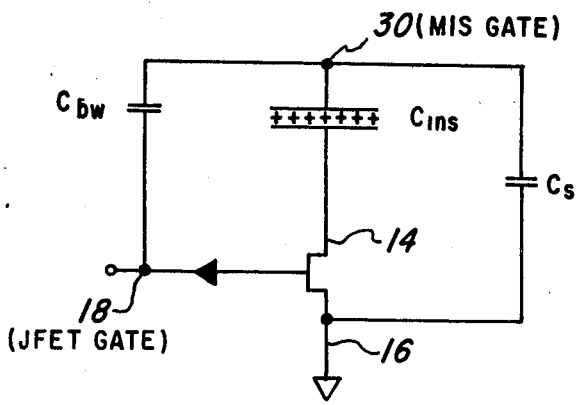

If positive charge had been previously programed into the memory insulator 15, the state shown in FIG. 4a occurs with an inversion layer. Now the inversion layer connects the bottom electrode of the memory capacitor to the JFET gate electrode through a variable but low channel resistance 32. The source 14 of the JFET is now separated from the inversion layer by a depletion layer capacitance $C_d$. The capacitance between the bit line and the word line is now $(C_{bw}+C_{ins})$ which can be much larger than $C_{bw}$ that by itself is the interelectrode capacitance for the programmed state of FIG. 4b. It is important to note that the charge programed into the memory insulator 15 does not change $C_{ins}$ but has its effect on programed capacitance through the connection of $C_{bw}$ and $C_{ins}$ obtained by the inversion layer. In the circuit of FIG. 1, only one cell is shown on the bit line. In a practical array, many cells are placed on one bit line, thus resulting in an extra stray capacitance $C_s$ (of FIG. 4). In the read operation, a pulse or negative going voltage step is placed on the word line and the resulting voltage step is sensed on the floating bit line. In the case of an accumulation layer as in FIG. 4b, the bit line voltage change $\Delta V_B(-)$ is related to the change in the word line voltage step $$\Delta V_w \text{ by } \Delta V_B(-) = \frac{C_{bw}}{C_{Bw} + C_{ins} + C_s} \Delta V_w$$

In the case of an inversion layer as in FIG. 4a, the corresponding change is $$\Delta V_B(+) = \frac{C_{Bw} + C_{ins}}{C_{Bw} + C_{ins} + C_s} \Delta V_w$$

and the difference between the states is $$\Delta V_B(+) - \Delta V_B(-) = \frac{C_{ins}}{C_{Bw} + C_{ins} + C_s} \Delta V_w$$

The sensitivity of the read operation is increased by minimizing the stray capacitance $C_s$ which is mainly due to the other cells on the bit line. The stray capacitance $C_s$ is minimized by reverse biasing the JFET gates of all cells not being read on the bit line to a voltage sufficient to close the JFET channels and pull the inversion layers of these cells out from under the memory insulator. FIG. 4 has been drawn for the embodiment having the MIS gates attached to the bit lines. In the embodiment having the JFET gates attached to the bit line as in FIG. 2, the corresponding stray capacitance on the bit line includes the junction capacitance of the JFET gate 18. This junction capacitance is minimized by reverse biasing the JFET gate 18 and by using a lightly doped substrate, for instance $5 \times 10^{14}$ atoms/cubic centimeter doping. The capacitance of the cells not to be read or minimized by proper selection of the bit and word line voltages for the cells selected for reading and those not selected for reading.

Figure 5:
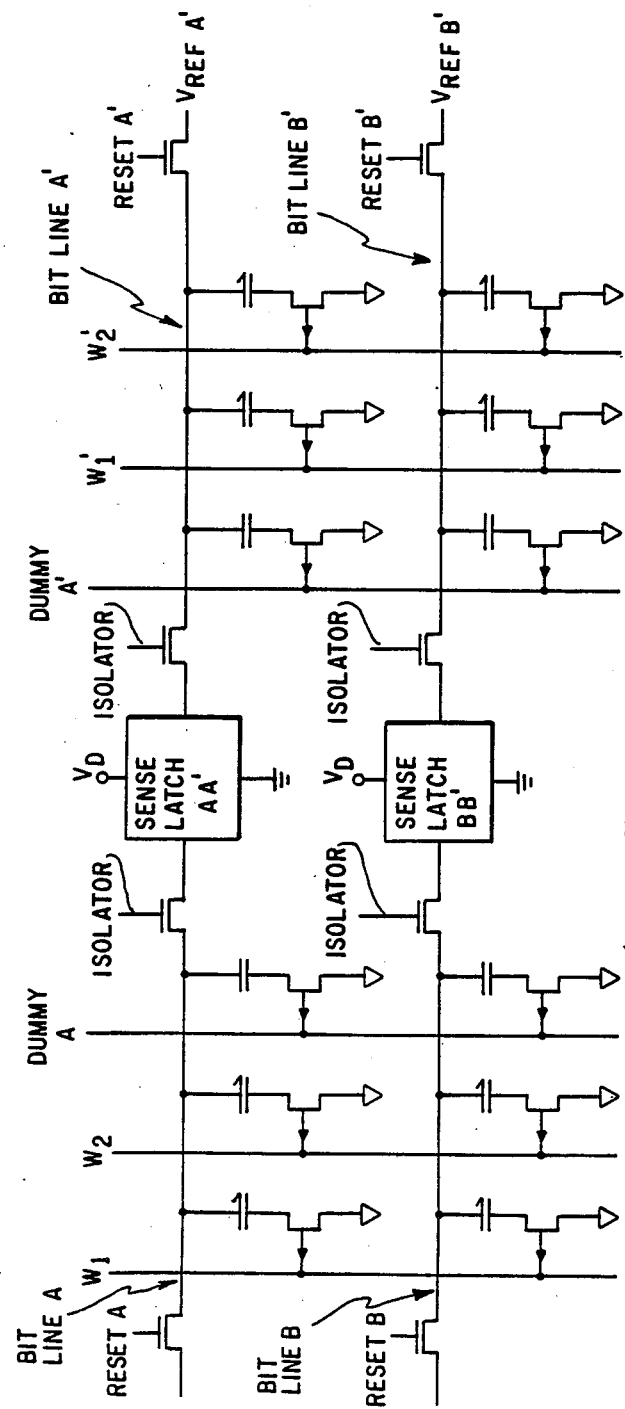
FIG. 5 shows the construction of the nonvolatile capacitor NVJRAM memory array with the MIS gate attached to the bit lines with sense latches.

The practical memory array will use sense latches as shown in FIG. 5, rather than output MOSFET's as shown in FIG. 1 and 2. Any of several sense latch designs common to the art of dynamic RAM's can be utilized. The memory shown in FIG. 5 has two sense latches, each of which have two bit lines with each bit line having two nonvolatile capacitor NVJRAM elements oriented with MIS gates on the bit lines and with one dummy cell on each bit line. Although a JRAM without nonvolatile insulator is shown as the dummy cell, a capacitor with a fixed capacitance which is the average of that of the two program states of the NVJRAM elements could have been used. Furthermore, although only two sense latches are shown and only two NVJRAM cells per bit line are shown, it should be obvious that larger memories with many sense latches and many NVJRAM cells per bit line could be used.

Figure 6:
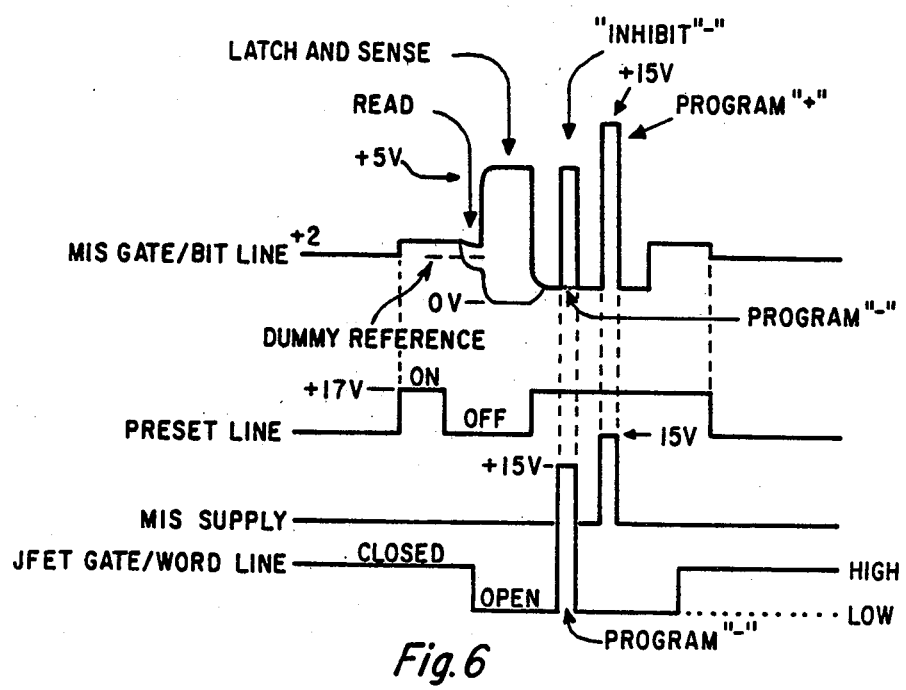
FIG. 6 shows the waveforms for operation of the nonvolatile capacitor NVJRAM memory using sense latches.

FIG. 6 shows the waveforms for the operation of the nonvolatile capacitor NVJRAM memory of FIG. 5. Both FIG. 5 and FIG. 6 use the embodiment with the MIS gate attached to the bit line, but the construction and waveforms for the embodiment with the JFET gate attached to the bit line should be obvious to those skilled in the art. In the read operation for bit lines aa', the preset transistors a and a' are turned on and both bit lines are preset to a low voltage of say, +2 volts with the optional isolator MOSFET's on. The preset MOSFET's are then turned off to float the bit line, and the word line voltage is decreased for the cell to read on bit line a and at the same time the word line voltage for the dummy cell on opposing bit line a' is decreased by the same voltage step. If the cell is in a programmed state of large capacitance, the voltage of the bit line a will decrease more than that on the bit line a' with the dummy cell. If the cell is in a programmed state of small capacitance, then the voltage on the bit line a will decrease less than on the bit line a'. At this point in time, the bit lines a and a' will have a small voltage difference. If it is required that the sense latch voltage not be fed back to the memory cell, then the optional isolation MOSFET's can be turned off before the sense latch is activated. When the sense latch is activated, the bit line will go to low voltage (zero volts) if the cell was in a large capacitance state, and would go to a voltage of intermediate value (+5 volts) if the cell were in the low capacitance state.

The state of the sense latch can now be interrogated. This operation of the sense latch is common to the state-of-the-art DRAM and any of several types of construction could be used. If it is required to reinforce or refresh the program state just read using the sense latch voltage, then the MOSFET isolators can be turned on again (or never turned off), and the +5 volt sense latch voltage can be applied to the gate of the selected MIS gate. This voltage tends to reinforce the low capacitance state of the cell which caused the sense latch to go to this voltage. If the cell had been in the high capacitance state, this MIS gate will receive zero volts in this operation and the information on this sense latch must be sent via peripheral circuitry to the word lines to send the selected word line to +5 volts to reinforce the high capacitance state. To accomplish this operation without other disturbing effects, all unselected bit lines must be at an intermediate voltage or floating. If the voltage step on the JFET gate to initiate the read operation had been positive going rather than negative going, the above mentioned reinforcement of the program state would not have been possible. In the second embodiment where the JFET gates are attached to the bit lines and the read initiation voltage step is applied to the MIS gate, a positive-going step is applied to the MIS gate, a positive going read initiation step would be the proper sign of voltage to obtain proper reinforcement of the programed state using the latch voltage.

The last portion of the cycle in FIG. 6 shows the preset transistor turned on again for reprogramming of the cell. As is shown, a larger voltage is used for programming (15 volts, for example) than for reading or reinforcing the memory state of the cell. The cell may be programmed using positive or negative voltage on the bit line as in patent application Ser. No. 228,413 or all positive voltages on the bit line and word line as shown in FIG. 6. Although the embodiments described in the figures utilize memory insulators, it should be recognized that the memory insulator could be replaced by a silicon floating gate which would be separated from the JFET source by an insulator layer and further separated from the MIS gate (which becomes the control gate) by another insulator layer. In these embodiments, the memory charge would be stored on the silicon floating gate which would in turn create an inversion or accumulation layer over the source. Likewise, the storage medium could be metal islands or interfacial doping with the insulator layer below and an insulator layer above separating the islands or dopant from the MIS gate. This cell and method of storage and reading provide significant advantages over the NVJRAMS currently known.

The method for reading the stored data has greater immunity to "read disturb" than standard JRAM's, as no positive pulse is required to prepare the empty "well" or in other words reverse bias the JFET source. Since the cells in an array are located at the intersection of word lines and bit lines, the array could be compared to a crosspoint capacitance nonvolatile memory. However, an array of cells of the present invention would be unlike the crosspoint capacitance nonvolatile memories, as it has a JFET device associated with each programable capacitance. This permits larger signal output, and eliminates pattern sensitivity.

Pattern sensitivity is the dependence of the signal output magnitude of the addressed bit upon the data written on all the other bits in the line.

While particular embodiments have been described herein, this should not be construed as a limiting factor. It is understood that various modifications may be undertaken without departing from the spirit and scope of the invention which is defined by the appended claims.

What is claimed is:

1. A non-volatile data storage cell comprising:
  a semiconductor substrate of a first conductivity type;
  a gate region, of a second conductivity type opposite to said first conductivity type, located at the surface of said substrate and extending through said cell;
  a first-conductivity-type region of said substrate extending up through said gate region to define a source region, surrounded by the surface of said gate region, at the surface of said substrate;
  an insulating layer covering said source region and said gate region;
  a multi-layer dielectric structure overlying said source region and recessed into said insulating layer such that a reduced thickness of said insulating layer is present between said dielectric structure and said source region than is present in other parts of said cell; and
  a conductive strip disposed on the surface of said insulating layer in contact with said multilayer dielectric structure and transverse to said source region.

2. A data storage cell as in claim 1, wherein said substrate is of P+ conductivity type, and said gate region is N+ type.

3. A data storage cell as in claim 2, wherein said multilayer dielectric structure comprises:
  a layer of silicon nitride upon said insulating layer and overlying said source region of said substrate;
  a layer of silicon dioxide upon said nitride layer; and
  a layer of titanium dioxide upon said silicon dioxide layer.

4. A data storage cell as in claim 2, wherein said multi-layer dielectric structure comprises:
  a layer of silicon nitride upon said insulating layer and overlying said source region of said substrate; and
  a layer of silicon dioxide upon said nitride layer.

5. The nonvolatile data storage cell of claim 1, further comprising means for programming said cell, selectively, either by applying a positive bias to said gate region, thereby creating an inversion layer at the surface of said source region and increasing interelectrode capacitance of the cell, or by applying a positive bias on the line which addresses said conductive strip thereby creating an accumulation layer at the surface of said source region and lowering said interelectrode capacitance of said cell.

6. An array of nonvolatile data storage cells as in claim 1, wherein respective ones of said conductive strips are coupled to sense latch circuits for detection of cell output voltage in a read operation.

7. An array as in claim 6, wherein each said conductive strip further comprises a MOSFET device in series between each said conductive strip and each said corresponding sense latch for selected isolation of said conductive strip from sense latch output voltage.

8. A method of reading data stored in an array as in claim 7, comprising the steps of:
(a) presetting a selected one of said conductive strips to a predetermined voltage;
(b) floating said selected one of said conductive strips;
(c) applying a positive-going or negative-going pulse to a selected one of said gate regions;
(d) detecting a selected cell output voltage signal on said selected conductive strip, simultaneously with application of said positive-going or negative-going pulse.

9. An array as in claim 6, wherein said sense latch circuits further comprise means for providing a latched output voltages to said gate regions and conductive strips of respective selected cells thereby providing enhancement of the programmed state of the cell which provided input to said sense latch.

10. An array of nonvolatile data storage cells as in claim 1, wherein respective ones of said gate region are coupled to sense latch circuits for detection of cell output voltage in a read operation.

11. An array as in claim 10, wherein each said gate region further comprises a MOSFET device in series between each said gate region and each said corresponding sense latch for selected isolation of said gate region from sense latch output voltage.

12. An array as in claim 10, wherein said sense latch circuits further comprise means for providing a latched output voltage to said gate regions and conductive strips of respective selected cells, thereby providing enhancement of the programmed state of the cell which provided input to said sense latch.

13. A method of reading data stored in an array as in claim 10, comprising the steps of:
(a) presetting a selected one of said gate region to a predetermined voltage;
(b) floating said selected one of said gate region;
(c) applying a positive-going or negative-going pulse to selected one of said conductive strips;
(d) detecting a selected cell output voltage signal on said selected gate region strip, simultaneously with application of said positive-going or negative-going pulse.

* * * * *